(12) United States Patent
Peled et al.

(10) Patent No.: US 6,526,544 B1
(45) Date of Patent: Feb. 25, 2003

(54) DIRECTLY VERIFYING A BLACK BOX SYSTEM

(75) Inventors: Doron A. Peled, Gillette, NJ (US); Moshe Y. Vardi, Bellaire, TX (US); Mihalis Yannakakis, Summit, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/396,830

(22) Filed: Sep. 14, 1999

(51) Int. Cl.$^7$ .............................................. G06F 17/50
(52) U.S. Cl. .............................................. 716/4; 716/5
(58) Field of Search .................... 716/1, 4–5, 16–18

(56) References Cited

U.S. PATENT DOCUMENTS

| | | | | |
|---|---|---|---|---|
| 5,291,499 A | * | 3/1994 | Behrens et al. | 714/796 |
| 5,325,528 A | * | 6/1994 | Klein | 709/312 |
| 5,526,465 A | * | 6/1996 | Carey et al. | 704/243 |
| 6,408,428 B1 | * | 6/2002 | Schlansker et al. | 716/17 |

* cited by examiner

Primary Examiner—Matthew Smith
Assistant Examiner—Paul Dinh

(57) ABSTRACT

A system and method for direct black box system verification is provided. For any property, a sequence of inputs for the black box is determined that will verify that the system exhibits the property. Counterexamples of the property are detected without inferring the black box's internal structure; that is, the verification proceeds without identifying all states and state transitions of the black box. A specification automaton operable to exhibit undesirable system behavior is constructed and it is then determined whether an accepting execution exists on the intersection of the black box and the specification automaton. To determine whether such an execution exists, the black box is configured such that it can be reset to its initial state upon command and such that the system indicates when an input is disabled from a current state. When an input is enabled, the implementation transitions to the next state. If an input is disabled, then there is no intersection on the input string. The inputs are determined through a search of a specification automaton for accepting sequences up to a given bound. The bound is the product of the number of states of the black box and the specification automaton.

4 Claims, 5 Drawing Sheets

DIRECTLY VERIFYING A BLACK BOX SYSTEM

FIELD OF THE INVENTION

This invention relates generally to system verification and more particularly to verification of black box systems.

BACKGROUND

Model checking is a collection of methods for checking the reliability of a system design. In model checking, a description of the system, typically some finite state machine description, is checked for some property, such as mutual exclusion or responsiveness. In automata-based model checking, the complement of the property of interest and the system or system feature of interest are represented as automata. If there is an accepting run in the complement of the property automaton that is executable by the system automaton, then the system exhibits a counterexample of the desired property.

Model checking, therefore, indirectly checks whether a system exhibits some behavior. Since model checking is not applied to an actual system, the check is only as good as the system model. If the model contains errors, verifying that the model exhibits some property will not necessarily verify that the system exhibits the property.

Testing, on the other hand, is usually applied to the actual system (also called the implementation), rather than a description of the system, and checks whether the implementation conforms to the design. The test engineer applies a sequence of inputs to the implementation and observes the behavior of the system in relation to the inputs. From these behaviors, it is determined whether the implementation conforms to a design model. Conformance testing, unlike model checking, is not typically used for checking whether the implementation satisfies some property, and these techniques will not check an implementation directly for a property.

It is also a disadvantage of known system verification techniques that model checking requires knowledge of the internal structure of the system. For example, the finite state machines commonly used in model checking reveal the system's states and state transitions. Without knowledge of this structure, model checking becomes impractical. In real world system design, however, the internal structure is not always available, particularly when the system has evolved through many revisions. In cases of black box systems, there are no satisfactory methods for directly determining whether the black box exhibits some property. A black box system is a finite state system where the states and state transitions are unknown. Such systems are said to have unknown internal structure.

There are limited techniques for identifying a state machine for a black box by inferring the structure of the black box system. For instance, if two machines with n states are not equivalent, then there is at least one input string with a maximum length of 2n−1 characters that distinguishes the machines. In other words, any machine with n states is characterized by its output for all input strings of length 2n −1 characters, and a black box is uniquely determined by applying all such input strings. To infer the structure, a tree of depth 2n −1 is constructed from the responses of the black box to the input string. The tree is minimized to produce a minimal machine consistent with these outputs. This approach is explained in B. A. Trakhtenbrot, Y. M. Barzdin, *Finite Automata: Behavior and Synthesis,* North Holland, 1973. Known model checking can then be used to check whether the machine satisfies some property.

The known methods for inferring a machine and then applying model checking are computationally inefficient and have not received widespread use. One disadvantage is that these techniques cannot be used until the entire machine is inferred. If the property could be checked without knowledge of all the structure, these resources are wasted. Furthermore, known black box techniques do not provide for on-the-fly conformance testing between the black box and the inferred model. A method that permits on-the-fly model checking directly on the black box and also provides for construction of a minimal model would greatly improve system design efficiency. The need remains, therefore, for a method for efficiently and directly checking that a system satisfies certain properties where the design and internal structure of the system are largely unknown, for constructing a model of such a system, and for verifying that the model conforms to the black box.

SUMMARY

A system and method according to the principles of the invention provides for efficient and direct black box system checking. A black box system (hereafter alternatively referred to as black box or black box system) is a finite state system where the states and state transitions are unknown. For any property, a sequence of inputs for the black box is determined that will verify that the system exhibits the property. Counterexamples of the property are detected without inferring the black box's internal structure; that is, the model-check proceeds without identifying all states and state transitions of the black box. An exemplary method includes constructing a specification automaton operable to exhibit undesirable system behavior and configuring a black box as an automaton. It is then determined whether an accepting execution exists on the intersection of the black box automaton and the specification automaton.

For a deterministic system having an upper bound of n states and where the permissible inputs to the system are known, the system can be checked for a property through experiments on the black box. An experiment is an application of an input or string of inputs to the black box. To run the experiments, the black box is configured such that it can be reset to its initial state upon command and such that the system indicates when an input is disabled from a current state. When an input is enabled, the implementation transitions to the next state. If an input is disabled, then there is no intersection on the input string. The inputs are determined through a search of a specification automaton for accepting sequences up to a given bound. The bound is the product of the number of states of the black box and the specification automaton.

The specification automaton is configured as a finite automaton on infinite words, such as a Büchi automaton. Its alphabet is included in the alphabet of the black box automaton. The specification automaton is searched for an accepting run. A run is accepting if the automaton has a prefix, $\sigma_1$, starting from an initial state and terminating in an accepting state followed by a cycle, $\sigma_2$, that begins with and terminates in the same accepting state. The experiments include inputting $\sigma_1 \sigma_2$ to the black box. There is an accepting execution on the intersection of the specification automaton and the black box, if, after the black box is reset to its initial state, the black box can execute $\sigma_1$ followed by $\sigma_2$ (n+1) times. In other words, if the black box is a three state system, there is an accepting execution on the intersection if the black box can execute the inputs of $\sigma_1$ followed by the inputs of $\sigma_2$ four times. If the intersection is empty, the specification automaton searches for another $\sigma_1\sigma_2$ and continues the check until the upper bound for $\sigma_1$ or $\sigma_2$ is reached.

$\sigma_1$ and $\sigma_2$ can also be used to generate a model of the black box. To do so, a conjectured model is model-checked with respect to the specification automaton. If the conjectured model exhibits the behavior described by the specification automaton, $\sigma_1$ and $\sigma_2$ are input to the black box. A successful run over the strings indicates that the black box also exhibits the undesired behavior. The strings are then used as a counterexample for generating another conjectured model with more states. If the conjectured model does not exhibit the behavior of the specification automaton, conformance testing determines whether the conjectured model conforms to the black box. Where the conformance test fails, the strings are used as the counterexample for generating another conjectured model. Where the conformance test passes, the black box satisfies the property and the conjectured model represents a minimal machine for the black box. In each case where a new conjectured model is generated, checking proceeds as above. The process terminates when either the black box and conjectured model converge or when an upper bound of states is reached.

BRIEF DESCRIPTION OF THE DRAWINGS

A more complete understanding of the invention may be obtained from consideration of the following description in conjunction with the drawings in which.

DETAILED DESCRIPTION

This description sets forth exemplary embodiments of a method and system for performing verification on a black box system. A method according to the principles of the invention implements automata-based model checking on black box systems. In one embodiment, a series of experiments on the black box determines whether the black box exhibits the desired property. In another embodiment, these experiments are used to build a model of the black box by monotonically incrementing the states of a conjectured automaton until the conjectured automaton and the black box converge or an error is discovered. If the convergence takes place without the conjectured automaton providing a word acceptable to the complement of the property automaton, and if the conjectured automaton conforms to the black box, then the black box is verified.

A. Automata-Based Model Checking

The automata-theoretic approach to model checking determines whether a system exhibits a property by determining whether there exists an execution over the intersection of a system automaton and the complement of a property automaton (specification automaton). The specification automaton can be constructed directly from some formalism, such as requirements, or the complement can be taken of an automaton that exhibits desired behavior. An execution on the intersection between the system automaton and the specification automaton indicates that the system executes a counterexample of the desired behavior, while the absence of an intersection verifies the presence of the checked property. Model checking using automata having known internal structure is further explained in Kurshan, *Computer-Aided Verification of Coordinating Process: The Automata-Theoretic Approach*, Princeton Univ. Press, 1995, which is incorporated herein by reference.

1. Automata

Automata are finite state machines that can execute or recognize a linear sequence of events. They are formally defined by a set of states, a subset of initial states, a subset of accepting states, a finite set of inputs (an alphabet), and a transition relation that maps for each letter of the alphabet each state to a set of next states. The state of an automaton depends upon its previous state and the input that triggers a state transition. Where a finite sequence of inputs terminates in an accepting state, the automaton recognizes the execution. For an infinite execution, the automaton recognizes the execution if the automaton generates an accepting state infinite times in the execution.

Figure 1:
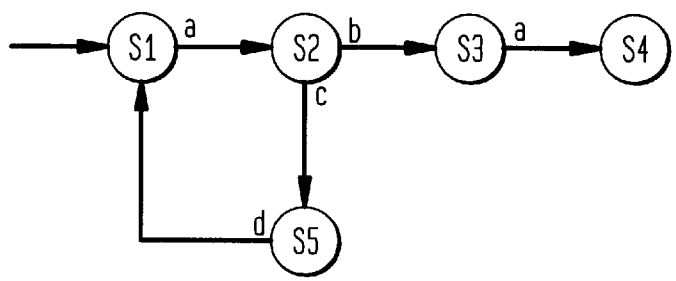
FIG. 1 shows an exemplary automaton.

An exemplary automaton is shown in FIG. 1. The automaton 100 consists of five states ($S_1 \ldots S_5$) and state transition relations a, b, c, and d. The sequence acdacd . . . represents an infinite execution because it can continue without terminating. If any of the states $S_1$ $S_2$ or $S_5$ is an accepting state, this infinite sequence is accepting. The symbols a, b, c, and d are the alphabet of the automaton 100. A sequence such as aba is a word, and the words denoting all the possible sequences comprise the language of the automaton 100. A finite input sequence is accepting if there is an execution labeled by the sequence that terminates in an accepting state. For example, if $S_4$ is an accepting state, the sequence aba is an accepting finite sequence.

2. Processing an Intersection between two Automata

One automaton useful in model checking is a Büchi automaton. Formally, a Büchi automaton is a quintuple (S, $S_0$, $\Sigma$, $\delta$, F), where S is a finite set of states, $S_0 \subseteq S$ are the initial states, $\delta$ is the finite alphabet, $\delta \subseteq S \times \Sigma \times S$ is the transition relation, and F $\subseteq$ S are the accepting states. A run over a word ($a_1 a_2 \ldots \in \Sigma$) is an infinite sequence of states ($s_1 s_2 s_3$ with $s_1 \in S_0$). A run is accepting if at least one accepting state occurs in the run infinitely many times. A word is accepted by a Büchi automaton when there exists a run accepting the word. The language of a Büchi automaton is the set of words that the automaton accepts. The use of Büchi automata in model checking is further discussed in M. Y. Vardi and P. Wolper, *An Automata-Theoretic Approach To Automatic Program Verification*, Proceedings of the First Symposium on Logic in Computer Science, Cambridge, UK, 322–331, 1986, and in Büchi, *On a decision method in restricted second order arithmetic,* Proceedings of International Congress on Logic, Methodology and Philosophy of Science, Palo Alto, Calif., 1960 at 1–11.

To determine an intersection between a black box automaton and a specification automaton according to the principles of the invention, the black box automaton is expressed as $B=(S^B, S_0^B, \Sigma, \delta^B, S^B)$. The number of states $|S^B|$ is bounded by some value n, $S_0^B$ is a singleton, and $F^B=S^B$, namely, all the states are accepting. The black box outputs 0 if the transition is disabled and 1 if it is enabled. Furthermore, the black box automaton is deterministic, i.e., if (s, a, t) $\in \delta^B$ and (s ,a ,t') $\in \delta^B$, then t=t'. In a deterministic system, any state can transition to one successor state from any enabled input. For a specification automaton $P=(S^P, S_0^P, \Sigma, \delta^B, F^P)$, the number of states $|S^P|$ is denoted by m.

The intersection (or product) B×P is then $(S^B \times S^P, S_u^B \times S_0^P, \Sigma, \delta', S^B \times F^P)$, where $$\delta' = \{((s, s'), a, (t, t')) | (s, a, t)\} \cdot \epsilon \delta^B \Lambda (s', a, t, ') \epsilon \delta^P\}.$$

The intersection contains (initial) states that are pairs of states of the individual automata. The transition relation relates such pairs following the two transition relations. The accepting states are pairs whose second component is an accepting state of P. The intersection can be expressed formally as $L(B \times P) = L(B)' \cap L(P)$. The intersection is not empty if there is at least one accepting run on the intersection.

B. Verifying A Black Box

In this description, a black box system is an automaton having unknown internal structure. The unknown internal structure of the automaton refers to its states and transition relations. For example, referring again to the automaton 100 of FIG. 1, its internal structure includes its states $S_1$ to $S_5$ and the transition relations, expressed as strings over its alphabet. In the method according to the principles of the invention, black box checking on deterministic systems is performed through a series of experiments on the black box and without inferring its internal structure.

1. Configuring the Black Box and the Specification Automaton

For purposes of this exemplary method, the implementation is considered a deterministic black box automaton with no more than n states and having a known input alphabet. The black box is configured such that it can be reset to its initial state upon command and such that the system indicates when an input is enabled or disabled from a current state. When an input is enabled, the implementation transitions to the next state. If an input is disabled, there is no transition and therefore no intersection over the string in which the input is included. The upper bound of n states for the black box is either known or assumed. Where the number of states is assumed, n is chosen large enough such that the number of actual states is less than n. Formally, this automaton is the same as B described in Section A(1) with the following additional structure: the reset is an additional symbol of $S^B$, not included in $\Sigma$, allowing a move from any state to the initial state.

The specification automaton is configured as a finite automaton of m states on infinite words (a Büchi automaton), as described in Section A(1). Expressed formally, the specification automaton P equals $(S^P, S_0^P, \Sigma, \delta^B, F^P)$, where the number of states $|S^P|$ is denoted by m. The size of the alphabet $\Sigma$ common to the black box and the specification is p. For the specification automaton, an accepting run has a prefix, $\sigma_1$, starting from an initial state and terminating in an accepting state (a finite sequence) followed by a string, $\sigma_2$, which is a cycle beginning at the same accepting state (an infinite sequence).

Each input of $\sigma_1$ and $\sigma_2$ is applied to the black box in a series of experiments. Expressed formally with respect to B and P, an experiment is a finite sequence $a_1 a_2 \ldots ak_{-1} \epsilon (\Sigma \cup \{reset\})^*$, such that there exists a sequence of states $s_1 s_2 \ldots s_k$ of $S^B$, with $s_1 \epsilon S_0^B$, and for each $0 \leq j < k$, either 1) aj=reset and sj $\epsilon S_0^B$ and (a reset move), 2) $(sj, aj, Sj+1) \epsilon \delta^B$ (an automaton move), or 3) there is no t $\epsilon S^B$ such that $(sj, aj, t) \epsilon \delta^B$ and sj+1=sj (a disabled move). In other words, for each experiment on the black box, the black box will either reset to its initial state, transition to one successor state, or indicate that the move is disabled.

2. Processing the Experiments

Figure 2:
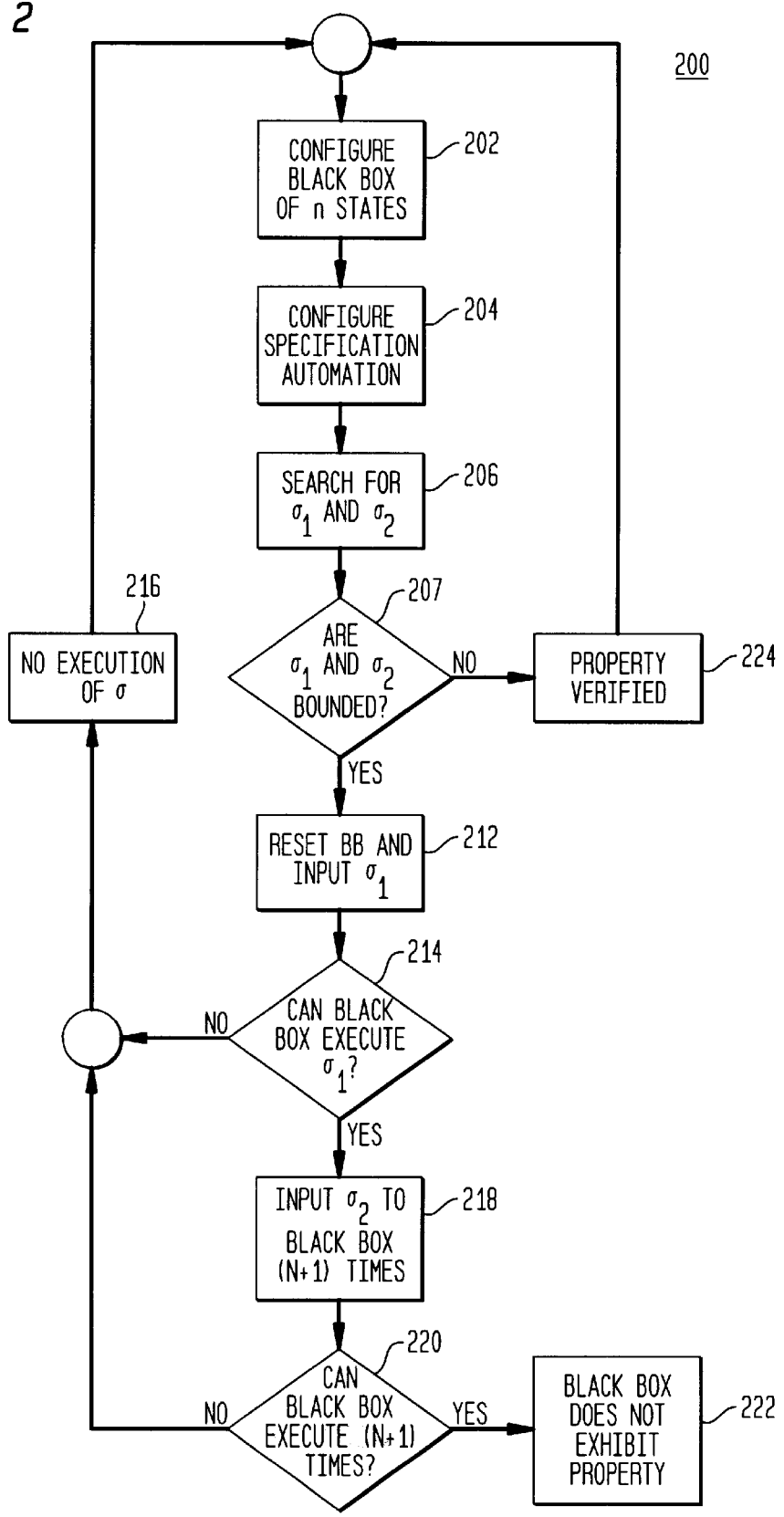
FIG. 2 shows an exemplary flow chart illustrating an exemplary method according to the principles of the invention.

An exemplary method for processing the experiments according to the principles of the invention is illustrated in the flowchart 200 of FIG. 2. In process steps 202 and 204, the black box and the specification automaton are configured for verification as previously described. The verification proceeds by searching the specification automaton for an input string, $\sigma_1 \sigma_2$, as at 206. It is determined whether the length of $\sigma_1$ or $\sigma_2$ exceeds the product of m and n in a decision step 208 In other words. neither $\sigma_1$ or $\sigma_2$ should have more states than the product of m and n. If $\sigma_1$ or $\sigma_2$ exceed this bound, the property is verified and reported, as at 224. If $\sigma_1$ and $\sigma_2$ are bounded by the product of m and n, the verification check continues.

To determine whether the black box executes an accepting run on the intersection of the specification automaton and the black box, $\sigma_1$ is input to the black box after resetting the black box to its initial state, as at 212. For each input in the string, it is determined whether the black box can execute the input in a decision step 214. If it cannot execute an input, the specification automaton and the black box do not intersect over the string, which is reported at 216. If the black box can execute $\sigma_1$, the inputs of $\sigma_2$ are applied to the black box (n+1) times in a process step 218. Applying $\sigma_2$ (n+1) times assures that the black box repeats at least one state in the cycle. If the black box can execute the cycle, $\sigma_2$ (n+1) times, it is considered capable of executing the cycle infinitely many times. If the decision step 220 determines that the black box can execute $\sigma_2$ (n+1) times, an execution on the intersection is indicated at 222. If the black box cannot execute $\sigma_2$ (n+1) times, the absence of an intersection over this string is reported, as at 216. The process of searching for inputs and applying them to the black box continues until all bounded executions, $\sigma_1 \sigma_2$, are applied to the black box.

This method is further explained with reference to an exemplary black box automaton shown in FIG. 3A. The automaton is a three-input vending machine 300. The three known inputs are a coin slot 302, a first selection button 304 and a second selection button 306. The machine 300 provides at least two outputs, change 308 and merchandise 310, although all the precise outputs are unknown. The input alphabet is at least COIN, FIRST SELECTION and SECOND SELECTION. The system 300 has an upper bound of states, although this upper bound is unknown. The system 300 is also deterministic, because any input transitions to only one successor state. When an input is applied, the system 300 will either make the move or indicate that no move is made (no change or merchandise is given). The system 300 is a black box because nothing is known about the states or transitions of the machine.

Figure 3A:
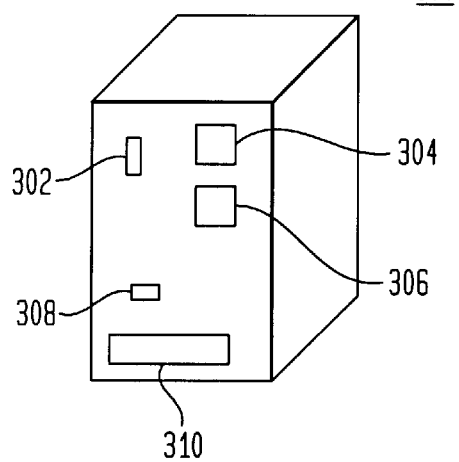
FIGS. 3A and 3B shows an exemplary black box and an exemplary automaton according to the principles of the invention.
Figure 3B:
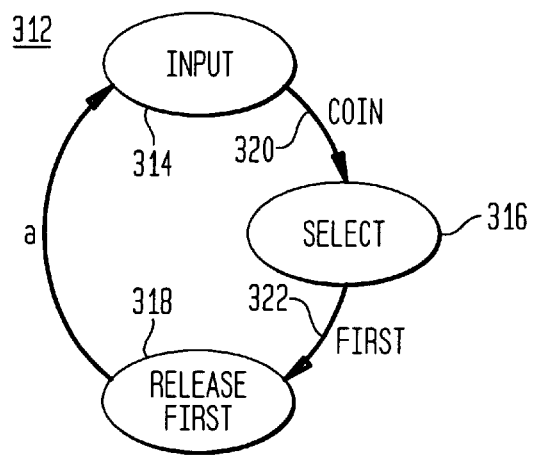

An exemplary property automaton is shown in FIG. 3B. This exemplary property automaton 312, for ease of illustration, represents a desired property (rather than its complement) that when coins are input, the user can select a product and the product is then delivered. It is a simple three-state automaton that includes the same alphabet as the vending machine 300 of FIG. 3A. This specification automaton 312 possesses the property that when COIN 320 is input, the SELECT state 316 is enabled. When FIRST 322 is input to the SELECT state 316, the RELEASE FIRST state 318 is enabled. The machine 312 then transitions over α to the INPUT state 314 to await another input. For this autr. baton 312, m is three, the initial state is INPUT 312 and the accepting state is RELEASE FIRST 318. With respect to the strings, $\sigma_1$ is COIN 314, FIRST 322 and $\sigma_2$ is COIN 314, FIRST 322, a, COIN 314, FIRST 322, a, . . .

Referring to FIGS. 3A and 3B, assuming n equals five, the property is satisfied if the vending machine 300 can execute COIN 314, FIRST 322 followed by a, COIN 314, FIRST 322 six times. This assures that the vending machine 300 intersects the accepting state RELEASE FIRST 318 at least twice in the cycle. If the system 312 will execute the accepting state at least twice, it will execute the string infinitely many times (as required by the property automaton 312).

This processing is further explained with respect to the psuedo code presented below. This code segment finds a deadlock (no enabling input available) in an automaton of unknown structure

```
init⇒       i: =1; r:=n + 1; V:=false;
            A[1]:=1; apply (reset); try(α₁);
success⇒    if r≦k − 1 then try(α_{A[r]}); r:=r+1;
            else if r= i then A[i]: = A[i] +1;
              r: = n + 1; try(α_{A[i]});
            else i: = i + 1; A[i]: =1;
              V: = false; try (α₁);
fail⇒         A[i]: = A[i] + 1;
            if A[i] ≦ p then try (α_{A[i]})
              else if i = 1 and V then WIN (−)
                else if not V then WIN (+)
                  else r: =2; V: = true;
                    i: =i − 1; apply (reset); try (α_{A[i]});
```

The method of this exemplary code segment checks systematically the tree of possible sequences in the automaton for a deadlock, starting from the initial state. Each configuration includes the vector A, the counters i and r, and the Boolean variable V. The experiment try (γ), where γ corresponds to the label of the move, is an attempt to apply a transition from the current state of the black box automaton. The prefix of the array A keeps track of the sequence of moves (actually the letters representing the moves) that successfully changed the state of the black box automaton since the last reset. The Boolean variable V is set to true when, since the last reset, a sequence of moves of length i successfully transitions the black box. The counter r is used for simulating backtracking by repeating a successful sequences of moves kept in the prefix of A. The guard init represents the initial configuration. The guards success and fail represent the label of the most recent move of the environment. WIN (+) and WIN (−) correspond to finding a deadlock and to concluding that no deadlock exists, respectively.

In addition to the data structures used in the above black box deadlock detection strategy, for each configuration, the set of states of P (a specification automaton) that are reachable from the initial state are retained, while trying the most recent moves since the last reset. A search for two paths in P of length bounded by mn is performed using the above computational model. The model is related to solving games of incomplete information and is further explained in Peled, Yannakakis, and Vardi, *Black Box Checking,* Formal Methods For Protocol Engineering and Distributed Systems, 1999. The first path, $\sigma_1$, terminates in a state whose P component, t, is accepting. The second path $\sigma_2$ cycles through t as well. For each such pair, the method applies the second path, $\sigma_2$, to the black box n more times. If the application is successful, there is a cycle in the intersection through a state with a t (which is accepting) as the P component, since there are at most n ways to pair t with a state of the black box, B. In such a case, there is an infinite accepting path in the intersection.

To determine the input strings in this exemplary procedure, each term in the string is generated such that the paths are enumerated. When searching for the strings $\sigma_1$ and $\sigma_2$, the search is limited to strings that can be extended to accepting strings of the specification automaton. In other words, strings that cannot terminate in an accepting state are not searched and are not input into the black box. Furthermore, the length of strings may be initially limited and then increased as the search continues. In this way, if the actual size of the black box is much smaller than n, errors are found earlier than if all possible strings are generated. Also, after an unsuccessful run, the system can be reset and incremented to the previously current state to await the next input. The search concludes when a string of length greater than mn is generated. If no errors occur, the black box is verified.

It should be apparent that this exemplary method is not limited to properties specified by automata on infinite strings. For properties specified by automata on finite strings (i.e., depend essentially on finite computations), the method is applied to generate a, only. In other words, it is determined whether any finite accepting string in the specification automaton is fully enabled in the black box system.

C. Generating A Model with Internal Structure

Figure 4:
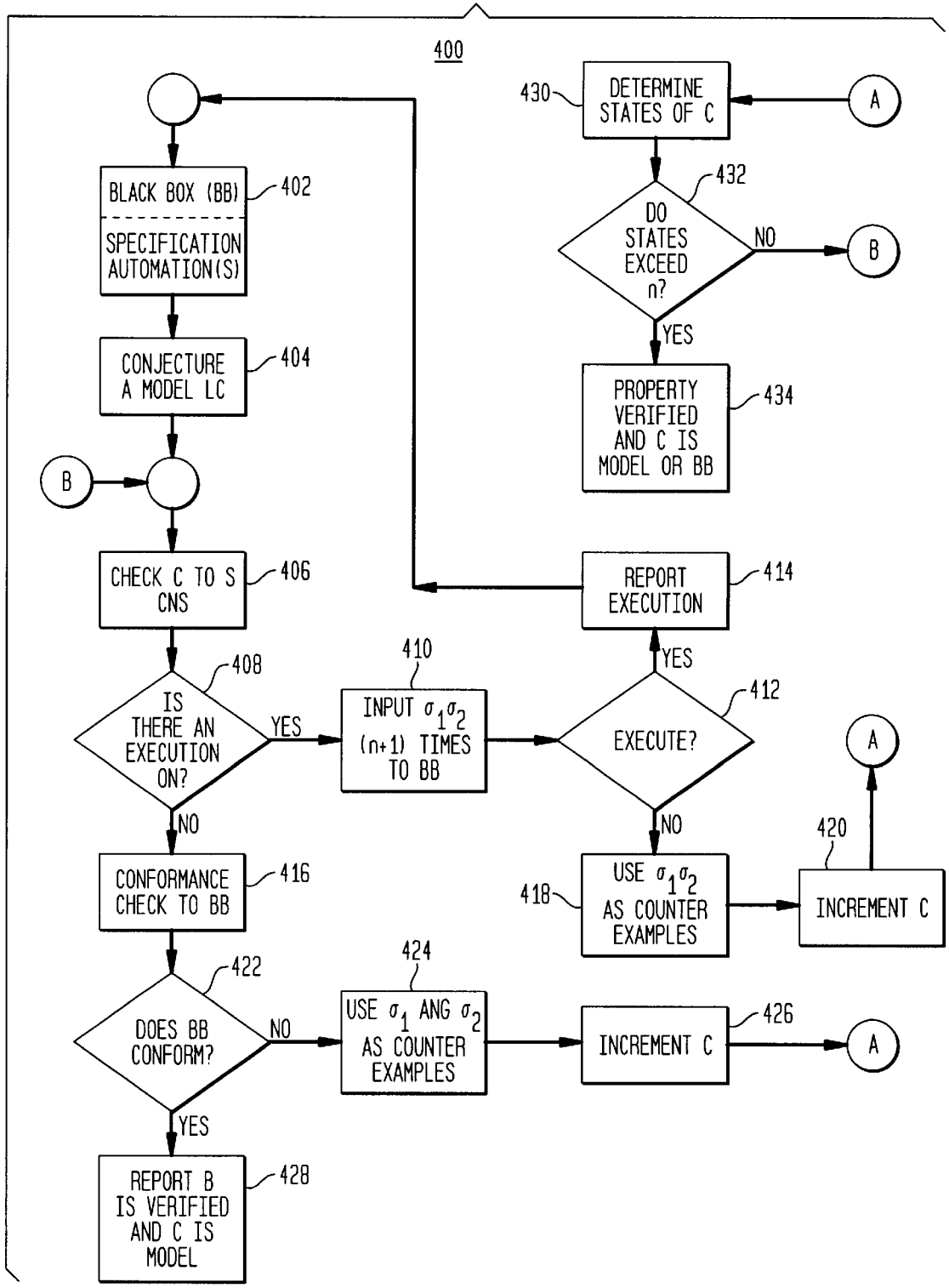
FIG. 4 shows an exemplary flow chart illustrating an exemplary method according to the principles of the invention; and, FIGS. 5A and 5B show an exemplary system for carrying out a method according to the principles of the invention.

In another exemplary method, the verification process generates a model of the black box having internal structure or finds an error. Referring to FIG. 4, the flowchart 400 illustrates this exemplary method. The black box and a specification automaton are received in a receiving step 402. In a process step 404, a conjectured model is constructed. This conjectured model can be a simple model, having as little as one or two states. The conjectured model is model-checked with respect to the specification automaton using the techniques previously described, as at 406. If the conjectured model can execute an accepting sequence of the specification automaton, the model checking algorithm computes suitable sequences $\sigma_1$, and $\sigma_2$. Then $\sigma_1$ followed by $\sigma_2$ (n +1) times are applied to the black box, as at 410. In a decision step 412, it is determined whether the black box can execute these inputs. If the black box executes these inputs, the black box exhibits the behavior of the specification automaton. This is reported in a reporting step 414. If the black box cannot execute these inputs, the inputs, $\sigma_1$ and $\sigma_2$, are processed as counterexamples of the conjectured model in a process step 418 for generating a new conjectured model. This process step 418 provides an incremented conjectured model, as at 420.

In the case where there is no accepting run over the intersection of the specification automaton and the conjectured model, the conjectured model is conformance checked with the black box, as at 416. Conformance checking a model to a black box is explained in T. S. Chow, *Testing Software Design Model by finite state machines,* IEEE Transaction on Software Engineering, SE-4,3, 1978, 178–187 and M. P. Vasilewskii, *Failure diagnosis of automata,* Kibertetika, No. 4, 1973, 98–108 (hereafter referred to as the VC procedure). In a decision step 422, it is determined whether there is conformance between the conjectured model and the black box. Where the black box conforms to the model, the black box has no accepting run over an intersection with the specification automaton. This is reported in a reporting step 428. Where black box does not conform to the model, the counterexample sequence found by the conformance testing algorithm is used as counterexamples for providing an incremented conjectured model in a process step 424. This step provides the incremented conjectured model, as at 426.

When an incremented conjectured model (also referred to as a modified model) is provided, the number of states for the modified model are determined, as at 430. In a decision step 432, it is determined whether the states of the modified model exceed the upper bound of states for the black box. This upper bound can be known or assumed. If the states of the modified model exceed the upper bout states for the black box, the intersection between the black box and the specification automaton is empty. This is reported in a reporting step 434. Otherwise process control returns to the process step 406 where the modified model is checked with respect to the specification automaton. This process continues until there is an accepting run on the intersection of the black box and the specification automaton or until the process indicates that the intersection is empty. Where the intersection is empty, the resulting modified model is a minimal model for the black box.

The conformance check of the conjectured model with respect to the black box implements the VC procedure. To apply the VC procedure, the black box is assumed to have the same number of states as the conjectured model. The VC procedure is then applied to the black box and the conjectured model. If the conformance test succeeds for the number of states in the conjectured model, the conformance check is repeated after incrementing the assumed number of states for the black box by one state. This checking and incrementing process continues until the upper bound, n, is reached successfully. If the upper bound, n, is reached, then the model conforms to the black box and the black box satisfies the checked property.

The VC procedure determines whether the black box and the conjectured model allow the same sequences. The conjectured model is initially trivial and then monotonically increased, and it is a minimal model for purposes of the VC procedure: there is no smaller automaton that recognizes the same sequences as the conjectured model. If an automaton is not minimized, it must have at least two states s and r that cannot be distinguished by any length of experiment (both s and r will allow exactly the same sequences). Minimizing a minimum, deterministic automaton provides a distinguishing set of states that each contains only one node. Each state in the conjectured model will allow or disallow the same sequences as the distinguishing set. As is known in the art, this distinguishing set can be used to determine whether the transitions of a black box behave in the same way as the transitions in the conjectured model.

To generate a modified model, the counterexample strings are used as input to a method for generating a new conjectured model. For each counterexample, the method returns a successively larger candidate automaton. The method is explained in Angluin, *Learning Regular Sets from Queries and Counterexamples,* Information and Computation, 75, 87–106 (1978). The procedure outlined therein identifies an unknown regular set from examples of its members and nonmembers. A minimally adequate Teacher addresses membership inquiries about the set, tests a conjecture about the unknown set, and provides counterexamples if the conjecture is not equal to the unknown set. A counterexample is a string in the symmetric difference of the correct set and the conjectured set.

A Learner correctly learns any regular set from any minimally adequate Teacher. For an unknown set U having a known alphabet A, a nonempty finite prefix-closed set of strings S, a nonempty finite suffix-closed set of strings E, and a finite function T mapping ((S∪S·A)·E) to {0,1}, the Learner process is:

```
Initialize S and E to {λ}.
Ask membership queries for λ and each a α ∈ A.
Construct the initial observation table (S,E,T).
Repeat:
    While (S,E,T) is not closed or not consistent:
        If(S,E, T) is not consistent,
            then find s₁ and s₂ in S, α ∈ A, and e ∈ E such that
                row (s₁) = row (s₂) and T(s₁ · a · e) ≠ T(s₂ · a · e),
            add a · e to E,
            and extend T to (S ∪ S · A) · E using membership
                queries.
        If(S,E,T) is not closed,
            then find s₁ ∈ S and a ∈ A such that
                row (s₁ · a) is different from row(s) for all s ∈ S,
            add s₁ · a to S,
            and extend T to (S ∪ S · A) · E using membership
                queries.
Once (S,E,T) is closed and consistent, let M = M (S,E,T,)
Make the conjecture M.
If the Teacher replies with a counter-example t, then
            add t and all its prefixes to S
            and extend T to (S ∪ S · A) · E using membership
                queries.
Until the Teacher replies yes to the conjecture M.
Halt and output M.
```

In this process, s, e, λ and t are strings. A contains each a and M is an acceptor over the alphabet A.

For purposes of this exemplary black box verification process, the results of the conformance checking processes provide the functionality of a minimally adequate Teacher. This Teacher provides two types of counterexamples. A simple counterexample is of the form where the word c belongs to one automaton and not the other. The other type is a pair of words $\sigma_1\sigma_2$ such that $\sigma_1\sigma_2^n$ belongs to one automaton but not the other. The known Learner algorithm is modified to use these two types of counterexamples. This modified method is hereafter referred to as the ANGLUIN method.

Black box verification according to the principles of the invention can also be expressed in pseudo code. For example, with reference to the automata defined in Section A(1) and B(1), the following code verifies a black box and generates a minimal model for the black box:

```
M₁:=ANGLUIN(empty, . . .);
i:=1;
learn: X:=M₁ x P;
       if L(X) = ∅ then
       k:=number of states of Mᵢ
       loop
              (conforms, σ) :=VC(Mᵢ, k);
              k:=k+1:
       until k > n or ¬conforms;
       in conforms then WIN(+);
    else
       let σ₁, σ₂ be s.t. σ₁σ₂^ω ∈ Σ L(X);
       if B allows reset σ₁σ₂ⁿ then WIN (−)
              else σ:=prefix of σ₁σ₂ⁿ not allowed by B;
    Mᵢ₊₁:=ANGLUIN(Mᵢ, σ);
    i:=i + 1;
    goto learn;
```

In the method of this code segment, the procedure call, VC($M_i$,k), calls the VC procedure for conformance testing the conjectured model $M_i$ with the black box automaton B, assuming that B has no more states, k, than $M_i$. VC returns (true,−) if the conformance test succeeds. If it fails, it returns (fail,σ), where σ is a word that is in one of the automata, B or $M_i$, but not the other. The procedure ANGLUIN accepts the previously attempted automaton (conjectured model) and the counterexample, and returns a new attempted automaton (modified model). In the first call to ANGLUIN, the method is executed with an empty automaton, and the second parameter (the counterexample) is ignored.

The method expressed in this exemplary code segment constructs a sequence of automata $M_1 \cdot M_2 \ldots$ that attempt to converge into the black box automaton B. Membership queries are experiments on the black box B. For equivalence queries, the method checks if a conjectured automaton, $M_i$, generates a word also accepted by the specification automaton P, namely if $L(M_i) \cap L(P) \sim 0$. If the intersection is not empty, it contains an ultimately periodic word of the form $\sigma_1 \sigma_2^\omega$. This conclusion is demonstrated in W. Thomas, *Automata on Infinite Objects,* Handbook of Theoretical Computer Science, MIT Press, J. van Leeuwen (Ed.), 135–192. The black box B is reset and $\sigma_1$ followed by $\sigma_2$ (n+1) times are input to the black box. If this experiment succeeds, then there is an error as $L(B) \cap L(P)$ contains $\sigma_1 \sigma_2^\omega$. This gives a counterexample for the equivalence of B with $M_i$. The counterexample is used in ANGLUIN method to generate the next candidate automaton with more states.

If $M_i$ does not generate any word accepted by P, the method checks whether $M_i$ conforms with B. k is the number of states of $M_i$. The conformance test between $M_i$ and B assumes that B has k states and applies the VC procedure. If the conformance test fails, the string is used as the counterexample in ANGLUIN to generate $M_i$+1. If the conformance test succeeds, it is repeated with k+1, k+2, . . . , n. If n is reached without an intersection, the black box satisfies the checked property.

D. Architecture of an Exemplary System

Figure 5A:
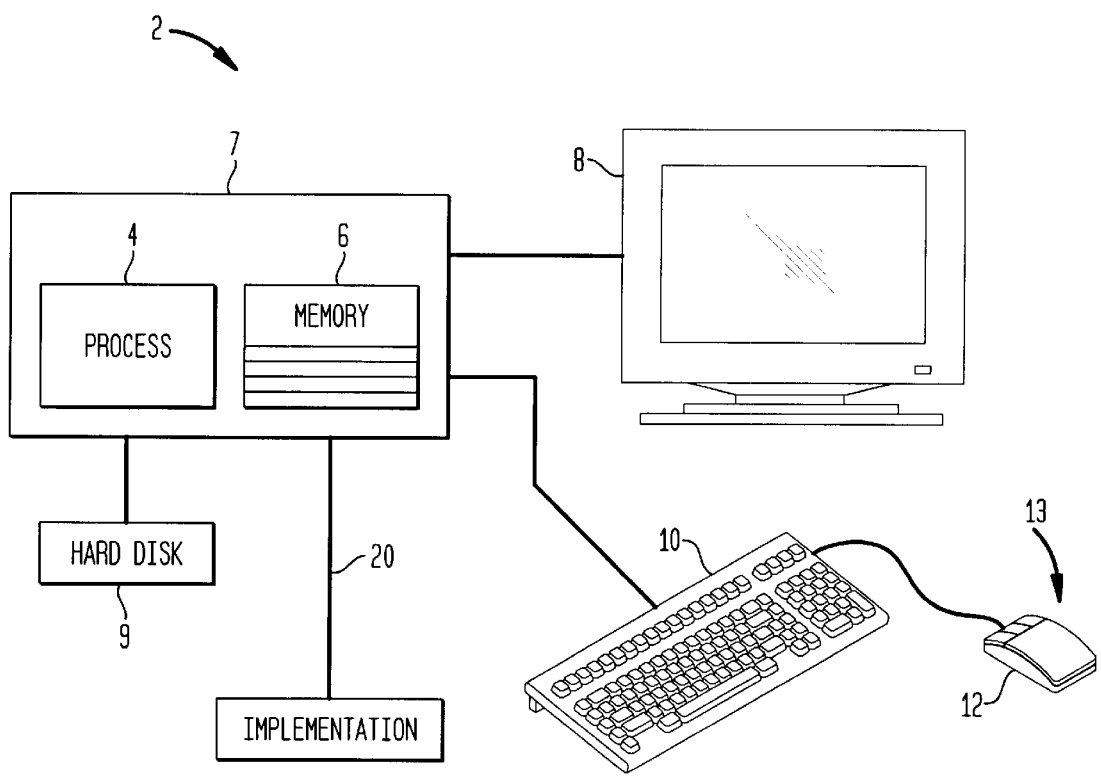

FIG. 5A illustrates an exemplary embodiment of a computer-based system 02 for carrying out the method of the invention. The system 02 comprises a processing unit 07, a display screen terminal 08, input devices, e.g., a keyboard 10, and storage devices, such as a hard disk 09. The processing unit 07 includes a processor 04 and a memory 06. The memory 06 includes areas for storing, among other things, instructions for the processor 04. A selection device 12 is operable to select objects displayed on the display 08 when the system 02 operates with a graphical user interface (GUI). The screen 08, keyboard 10 and selection device 12 are collectively known as user interface devices. An interface connection device 20 interfaces with an implementation 22 configured as a black box automaton according to the principles of the invention. The system 02 utilizes a computer operating system and a windowing system for providing an interface between the user and the GUI. The operating system and the windowing system can be found resident in the memory 06.

Processor 04 is a general-purpose processor capable of executing a stored program routine that implements the black box verification method described herein. Memory 06 can consist of a single memory chip or multiple banks of memory, and the memory 06 can include Read Only Memory (ROM) and Random Access Memory (RAM). The storage device 09 is capable of storing and transmitting data and can consist of multiple storage units that are linked together. The storage device 09 may store, among other things, automata representations and the output results produced by the method of the invention. The representations contain the information necessary for the system 02 to display, for instance, an automaton image on the system's 02 display terminal 08. These representations can also be kept in memory 06 and moved to storage 09. Representations and output results stored in the storage unit 09 are transmitted to processor unit 04 through an I/O bus (not shown). The processor 07 communicates with the implementation 22 through the interface connection device 20.

Figure 5B:
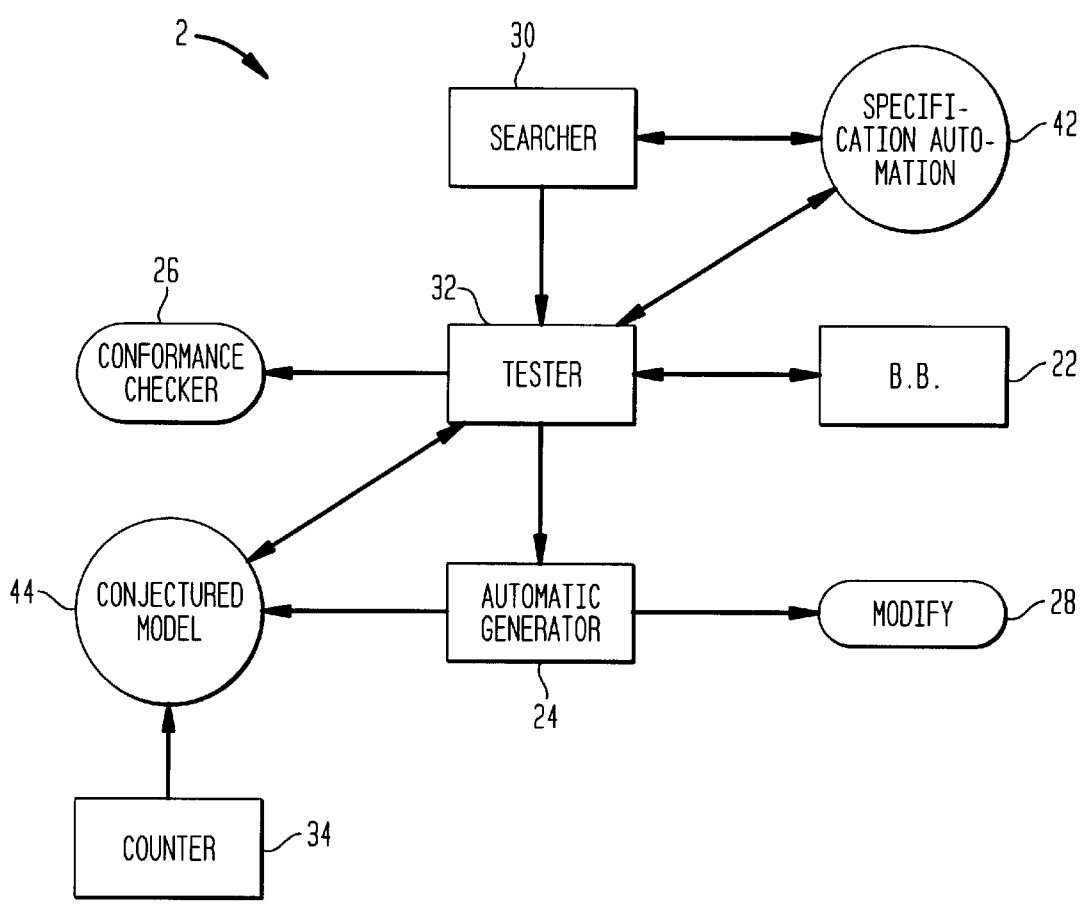

Referring now to FIGS. 5A and 5B, when the system 02 implements a set of instructions for carrying-out the method of the invention, the architecture includes an automaton generator 24 for generating and configuring automata, such as a conjectured model 44. To search a specification automaton 42 for input strings, the system 02 also includes a searcher 30 responsive to the specification automaton 42. The searcher 30 generates strings for application to the black box 22 by the tester 32. The black box 22 and the tester 32 communicate over the interface device 20, by which the tester 32 applies inputs to the black box 22 and receives outputs from the black box 22. The tester 32 interprets these outputs and causes the display terminal 08 to display messages indicating whether the input is enabled by the black box 22.

The tester 32 also implements conformance checking between the conjectured model 44 and the specification automaton 42. When a conformance check is required, the tester 32 calls the conformance checker procedure 26, which implements the VC procedure detailed in the discussion of FIG. 4 and the related pseudo code. A counter 34 monitors the size of the conjectured model 34, which is incremented by the automaton generator 24, when the tester 32 generates counterexamples. Counterexamples are generated when the conjectured model 44 intersects the specification automaton 42, and the black box executes the string over the intersection. Counterexamples are also generated when the conjectured model 44 does not intersect the specification automaton 42 and the black box does not conform to the conjectured model. To increment the conjectured model 44, the automaton generator 24 calls the modify procedure 28. The call returns the attributes of a new conjectured model 44 and the generator 24 constructs a model having the returned attributes.

As detailed above, the invention can be embodied in the form of methods and apparatuses for practicing those methods. The invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The invention can also be embodied in the form of program code, for example, in a storage medium, loaded into and/or executed by a machine, or transmitted over some transmission medium, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

What is claimed is:

1. A system for directly checking a black box system for a property, the black box system being a finite state machine having an unknown internal structure, the system comprising:

a searcher operable to determine at least one accepting sequence from a specification automaton, the accepting sequence describing a string of inputs; and a tester in communicative relation to the black box system, the tester operable to reset the black box system to an initial state and to apply the accepting sequence to the black box system, the black box system operable to transition to a next state when an input of the string is enabled and to signal the tester when an input of the string is disabled.

2. The system of claim 1 wherein the accepting sequence is of the form $\sigma_1\sigma_2$.

3. The system of claim 2 wherein the black box system comprises an upper bound of states, n, the tester applying $\sigma_1$ to the black box system followed by $\sigma_2$ (n+1) times.

4. The system of claim 1 further comprising:

an automaton generator responsive to the tester, the automaton generator operable to generate a conjectured model and to increment the conjectured model, the tester operable to determine whether the conjectured model recognizes the accepting sequence of the specification automaton, the tester causing the automaton generator to increment the conjectured model if the black box system cannot execute the accepting sequence and the tester reporting a failure if the black box system executes the accepting sequence; and a conformance checker responsive to the tester and operable to conformance test the black box system with respect to the conjectured model when the searcher provides no accepting sequence, the tester reporting a verification if the conformance test succeeds, the tester causing the automaton generator to increment the conjectured model if the conformance test fails.

* * * * *